United States Patent
Meyhofer et al.

(12) Patent No.: US 6,396,072 B1
(45) Date of Patent: May 28, 2002

(54) LOAD PORT DOOR ASSEMBLY WITH INTEGRATED WAFER MAPPER

(75) Inventors: Eric Meyhofer, Los Altos; Kenneth A. Hardy, San Jose; Cyril M. Kindt; Torben Ulander, both of Sunnyvale, all of CA (US)

(73) Assignee: Fortrend Engineering Corporation, Sunnyvale, CA (US)

( * ) Notice: Subject to any disclaimer, the term of this patent is extended or adjusted under 35 U.S.C. 154(b) by 0 days.

(21) Appl. No.: 09/541,199

(22) Filed: Apr. 3, 2000

Related U.S. Application Data

(63) Continuation-in-part of application No. 09/337,712, filed on Jun. 21, 1999.

(51) Int. Cl.$^7$ ............................................. G01N 21/86
(52) U.S. Cl. .................................. 250/559.4; 250/239
(58) Field of Search ..................... 250/559.4, 559.01, 250/548, 559.29, 219, 239, 559.33; 414/936–939, 405–408

(56) References Cited

U.S. PATENT DOCUMENTS

| | | | | |
|---|---|---|---|---|
| 6,013,920 A | * | 1/2000 | Gordon et al. | 250/559.33 |
| 6,138,721 A | * | 10/2000 | Bonora et al. | 141/231 |
| 6,220,808 B1 | * | 4/2001 | Bonora et al. | 414/217 |
| 6,281,516 B1 | * | 8/2001 | Bacchi et al. | 206/408 |
| 6,298,280 B1 | * | 10/2001 | Bonora et al. | 414/941 |

* cited by examiner

Primary Examiner—David P. Porta
Assistant Examiner—Pamela R. Hobden
(74) Attorney, Agent, or Firm—D. E. Schreiber

(57) ABSTRACT

A load port interface for determining the presence or absence of wafers in a cassette, i.e. a wafer mapper, is integrated with a port closure assembly in a load port interface separating a process environment from an operator environment. A cover plate and a door are arranged in an L-shape, with both members being able to seal the port in a bulkhead of the load port interface. In one configuration, the cover plate seals the port, while door panel members rest horizontally on the operator side of the bulkhead. In this position, a wafer stack, W, inside of a cassette may be placed on the inside door panel, with the top of the wafer stack, W, being open. As the door is raised from the horizontal position to a vertical position, the wafer stack, W, is rotated through an opening in the bulkhead so that the wafer stack, W, is now on the process side. The wafer mapper features a moveable trolley connected to, or within, the door. The trolley can move parallel to the wafer stack, W, under control of a stepper motor and examine each row of the stack, counting wafers as light is reflected or scattered from the edges of the wafers. Each wafer may be optically probed through a window in a cover plate and characteristic signals may be plotted to provide subsequent wafer manufacturing operations with wafer locations. A movable air knife on a side of the window opposite the trolley is magnetically coupled to the trolley and is moved together with the trolley in order to clear the window of liquid droplets from the process environment. When the load port interface positions the cassette and wafer stack, W, in the process environment, a fine spray of liquid droplets may be directed about the wafer stack, W.

27 Claims, 9 Drawing Sheets

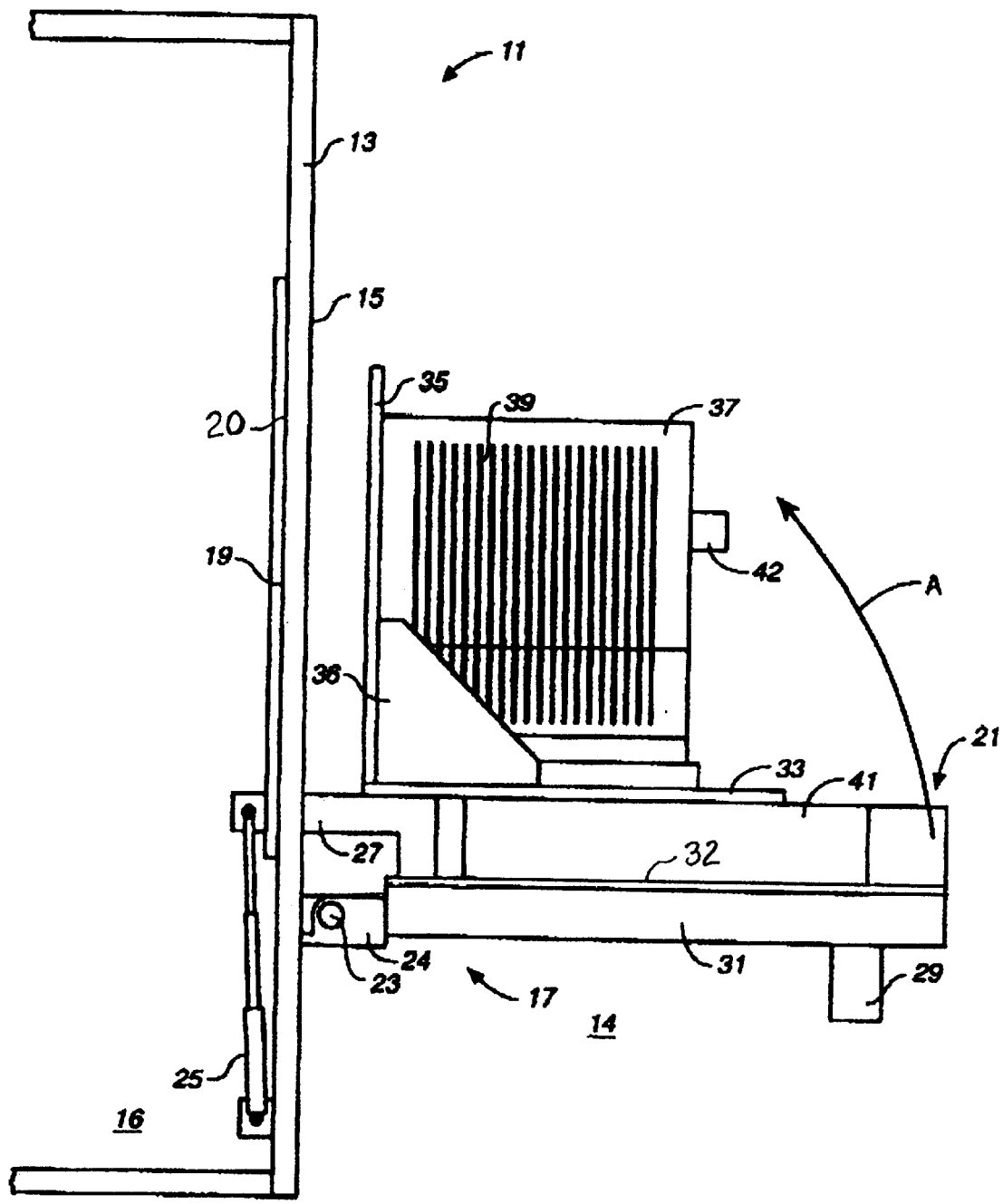
FIG._1

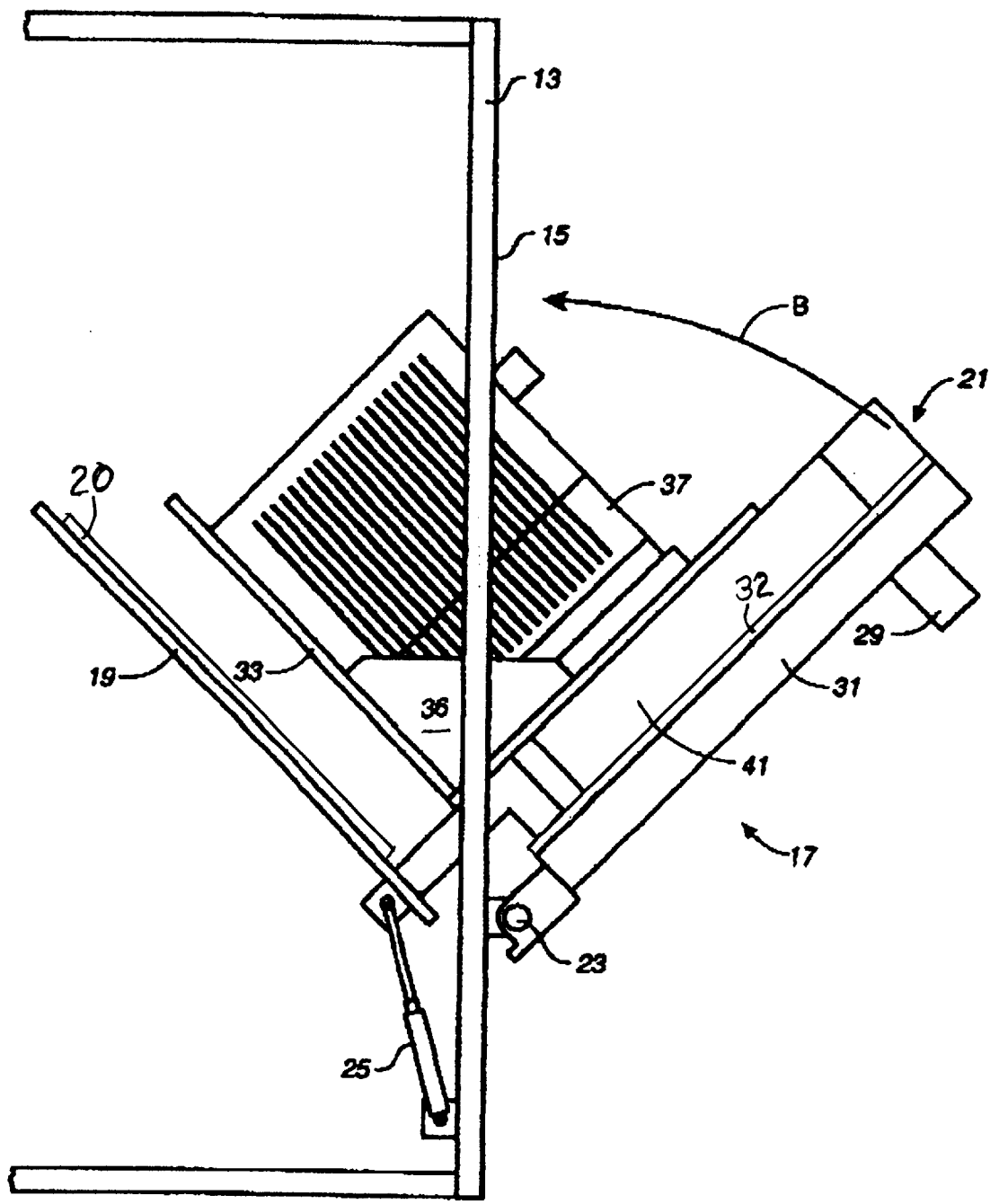
FIG._2

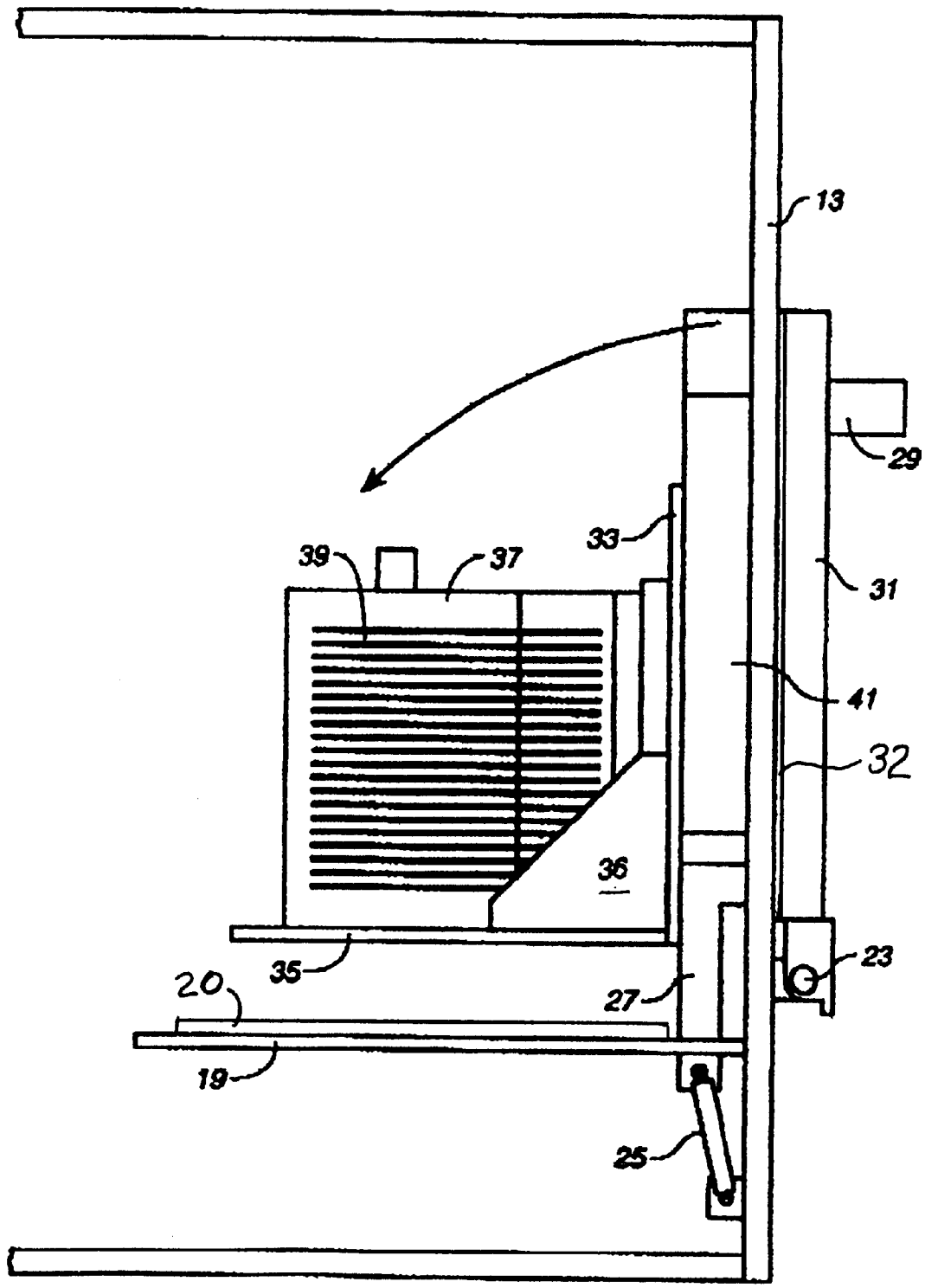
FIG._3

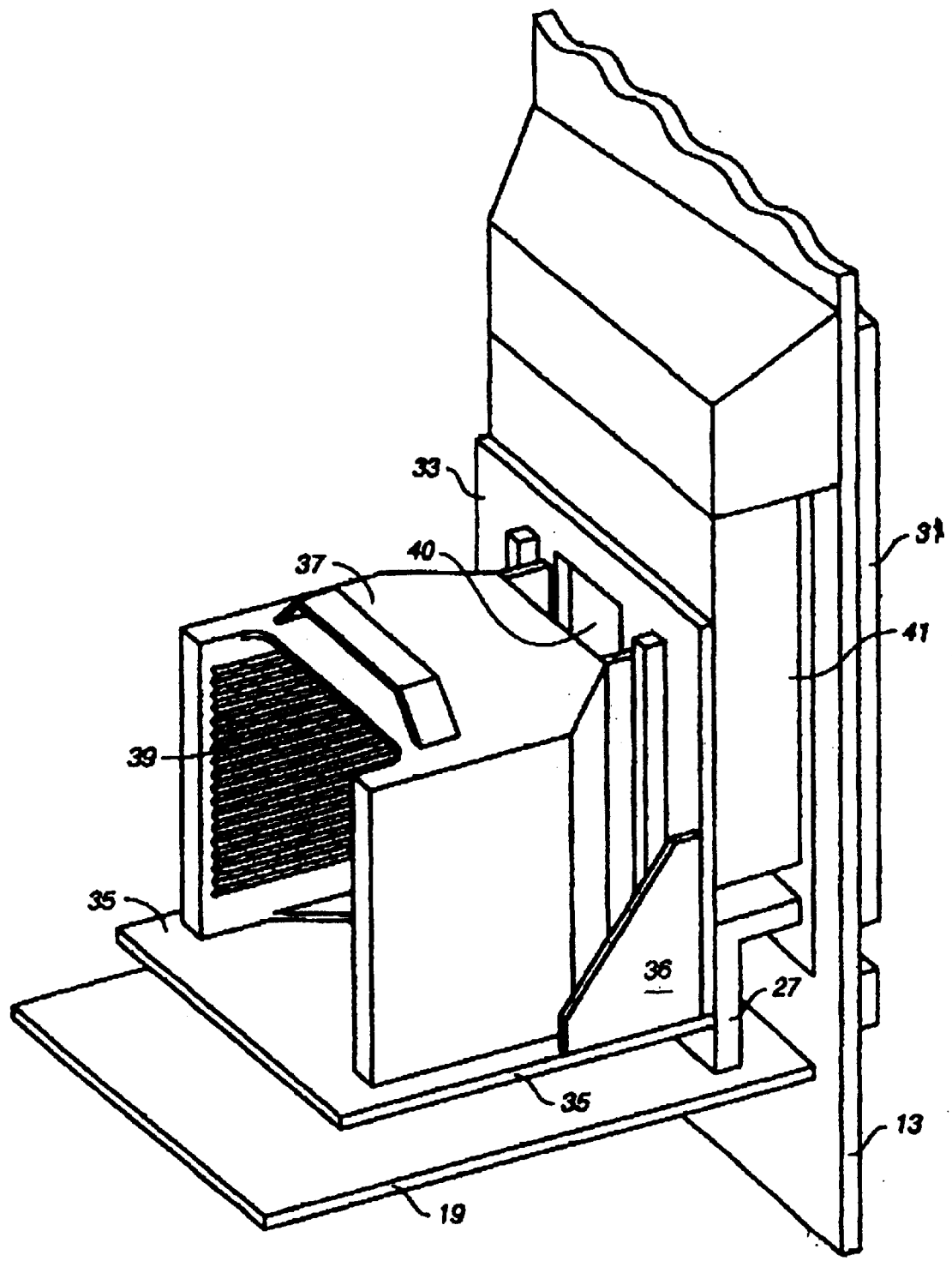
FIG._4

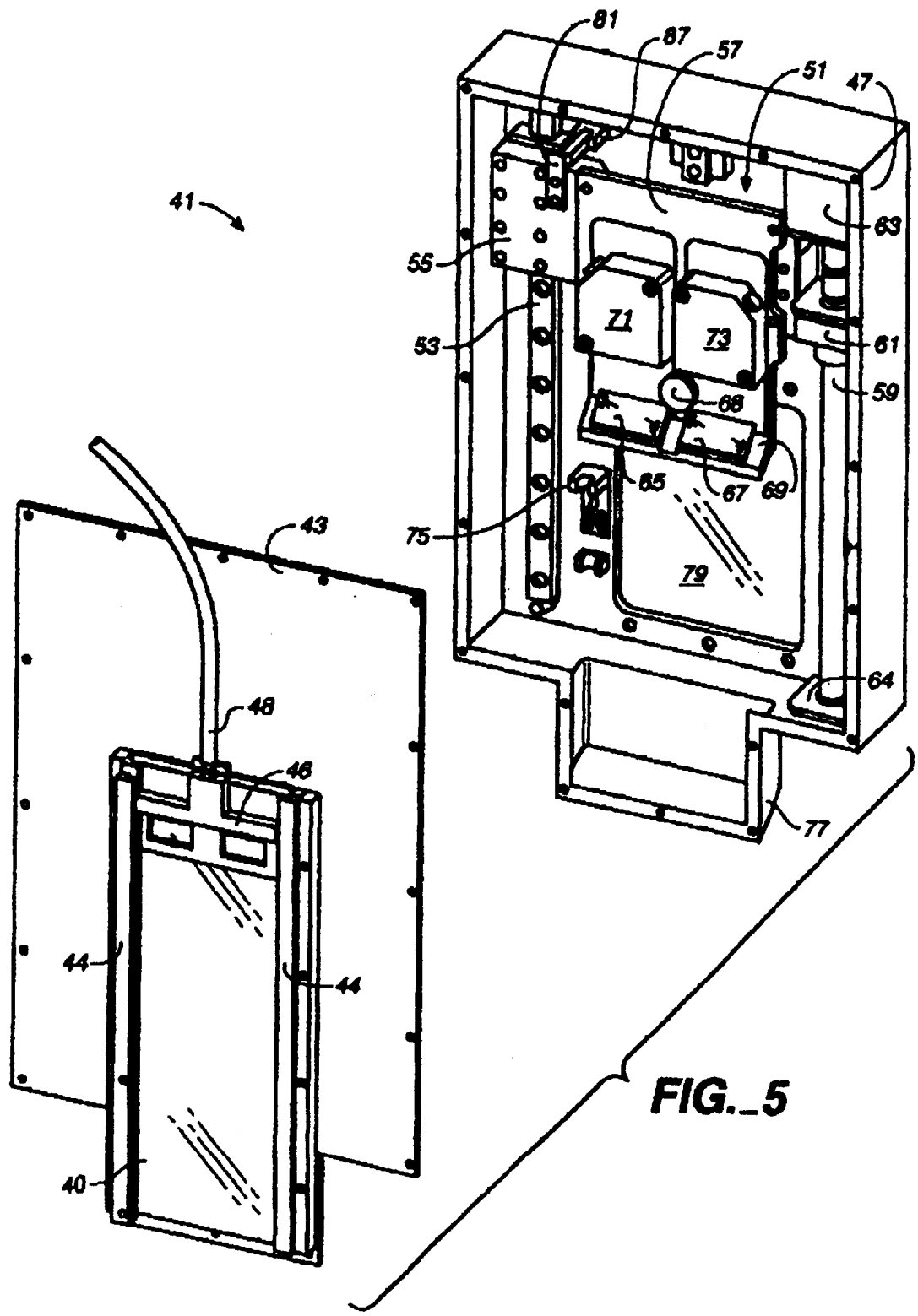
FIG._5

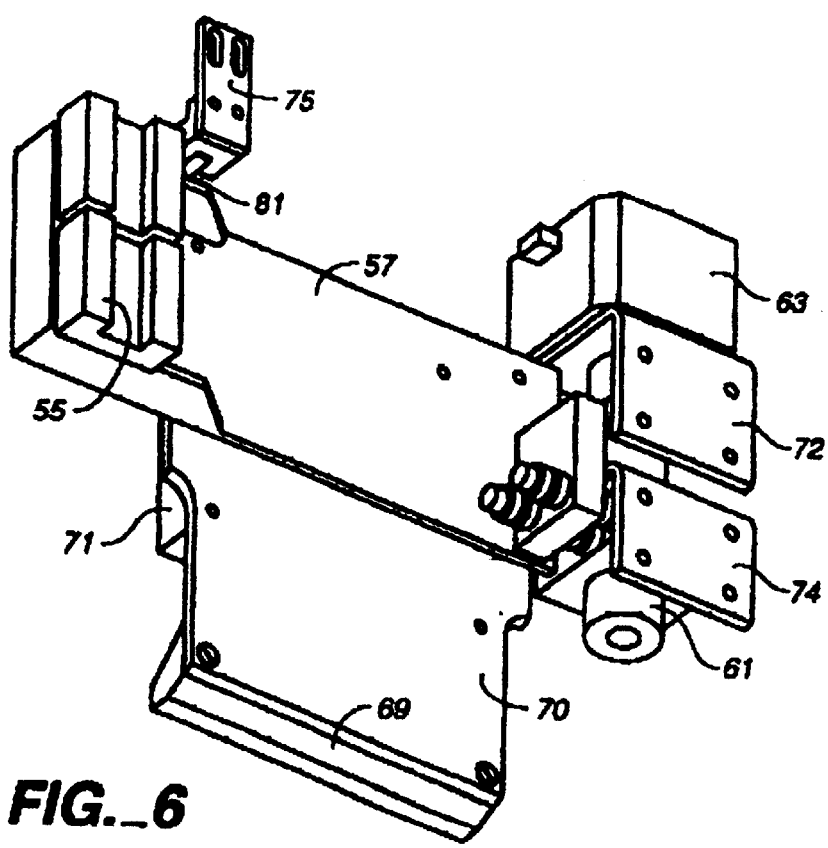
FIG._6
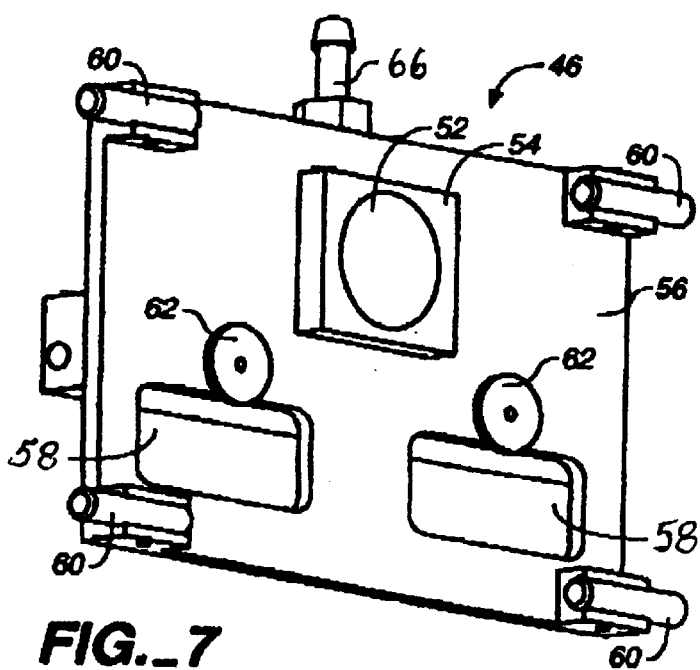
FIG._7

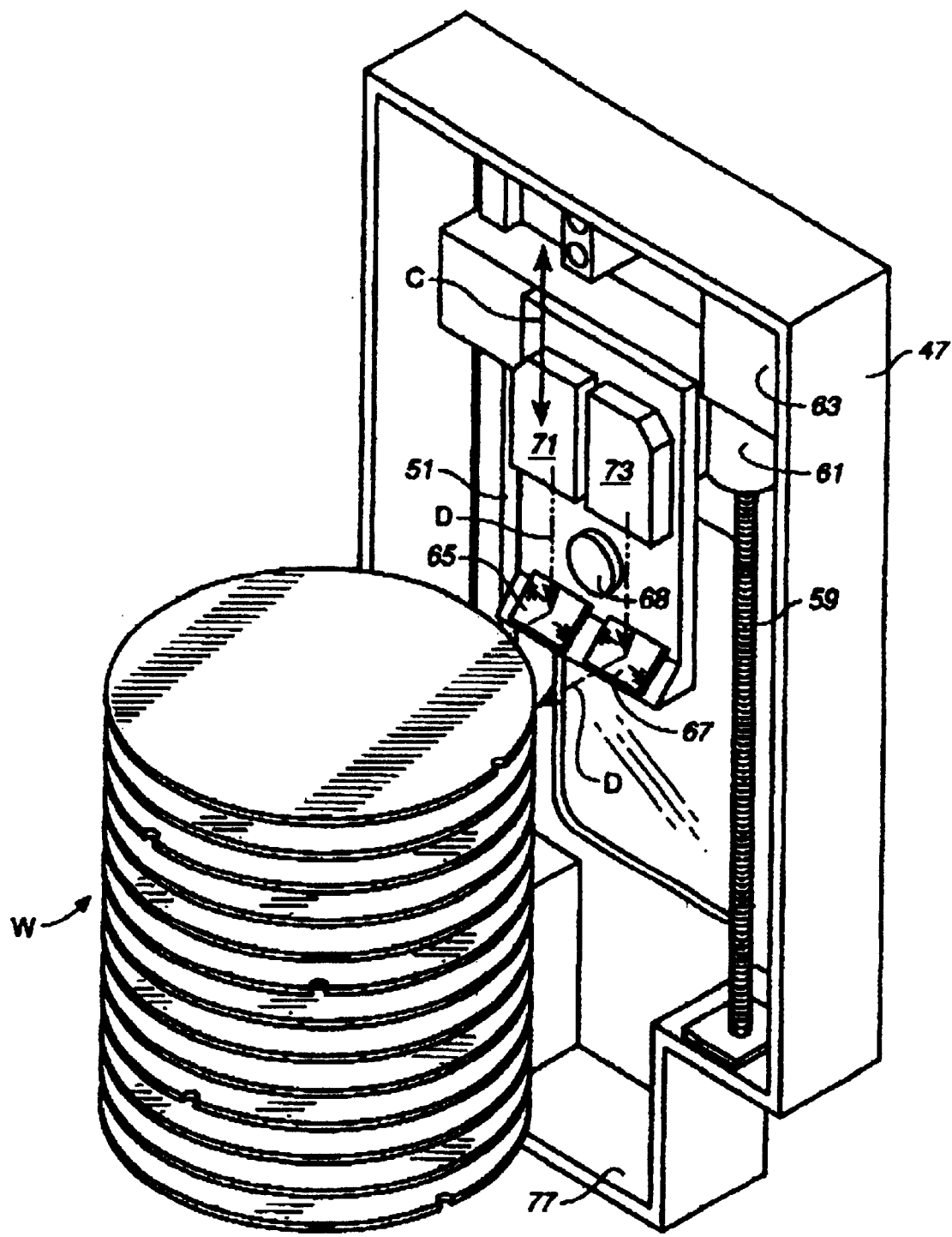
FIG._8

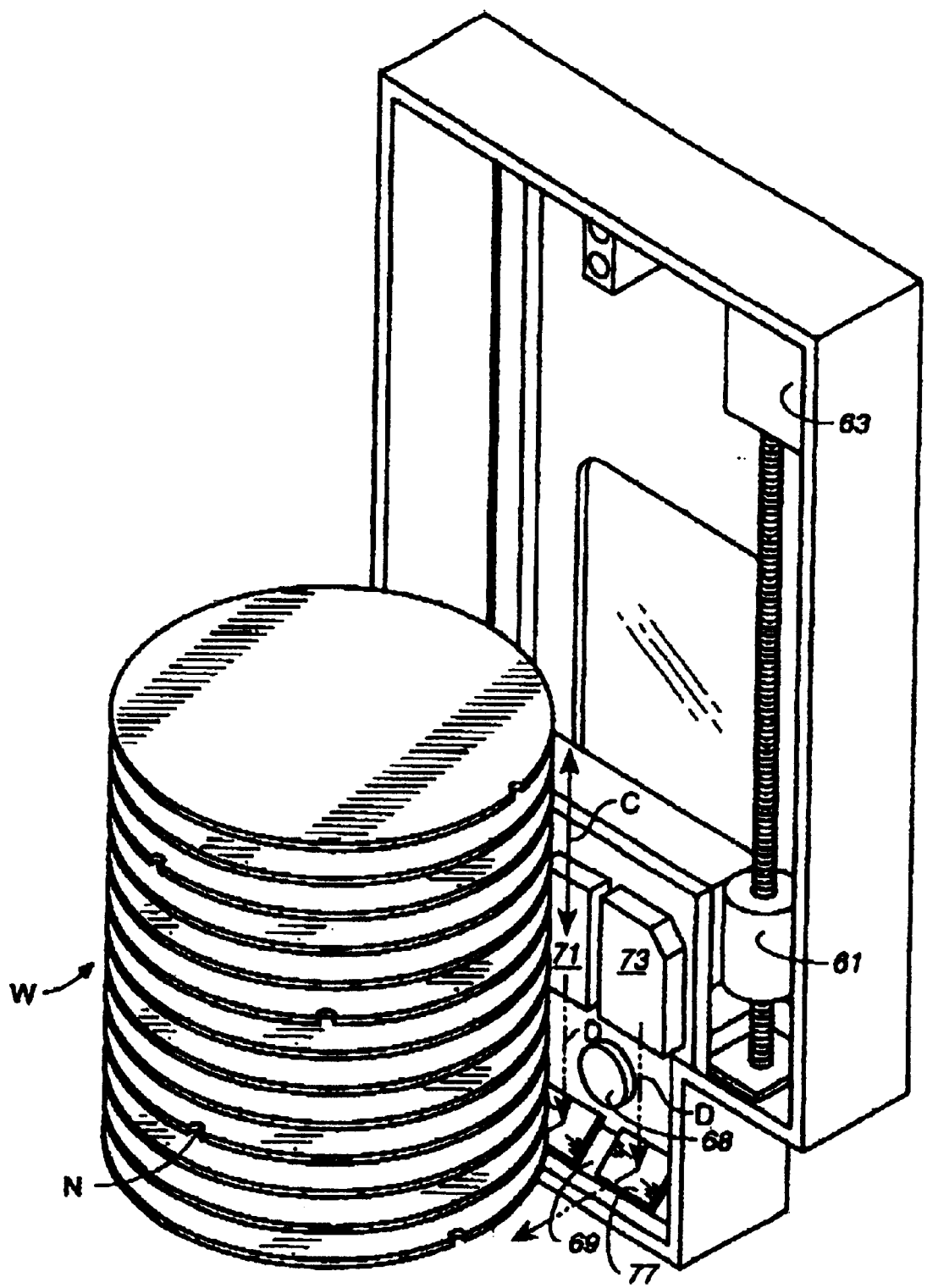
FIG._9

LOAD PORT DOOR ASSEMBLY WITH INTEGRATED WAFER MAPPER

CROSS REFERENCE TO RELATED APPLICATION

Continuation-in-part of U.S. patent application Ser. No. 09/337,712 filed Jun. 21, 1999.

BACKGROUND OF THE INVENTION

1. Field of the Invention

The invention relates to semiconductor processing equipment and, in particular, to a door for closing such equipment that, during a transfer operation, both detects objects and also maintains such objects wet.

2. Description of the Prior Art

In semiconductor manufacturing, integrated circuits are formed on silicon wafers during successive manufacturing stages involving formation and deposition of thin films on the wafers, together with selective removal of unwanted portions. To accomplish these operations, hundreds of individual steps are needed involving various pieces of process machinery, tools, measurement stations, ovens, cleaners and other equipment. Frequently, wafers are moved from one environment, such as an atmospheric pressure environment, to a different environment, such as a vacuum environment. To accomplish this, wafers are placed in cassettes or other carriers for mass transfer and the carriers are passed through a bulkhead separating the two environments. Sometimes the carriers are sealed units, such as pods known as SMIFs (Standard Mechanical Interface) or FOUPs (Front Opening Unified Pod). Other times, the cassettes are transferred outside of sealed units because the material, handling equipment does not need or use pods. For example, where a cassette is to be picked up by a robot arm, a cassette is merely transferred through a port in the bulkhead separating two environments.

In wafer handling using cassettes, it is desirable to have a wafer map indicating the number of wafers and position of the wafers within the slots of a cassette. In this patent application, the term "wafer map" refers only to number and position of wafers in a cassette. Having such a wafer map, another piece of equipment, such as a robot arm could be commanded to go to specific locations in the cassette to pick up or deposit a wafer. Without a wafer map, the robot would have to rely on its own sensors to determine whether a wafer was loaded in a particular slot of a cassette. Wafer mapping units are known. For example, U.S. patent application Ser. No. 09/038,809, by J. Gordon et al., assigned to the assignee of the present invention, discloses a wafer mapper unit for use with a FOUP. In that application, a robot arm, or end effector, associated with a load port interface, carries a wafer mapper so that wafer information can be used in connection with wafer processing and manufacturing equipment.

Although use of a wafer mapper with a FOUP is a substantial benefit, a more fundamental need exists, namely to provide a wafer mapper for use with cassettes independent of a FOUP. Yet, because of the large number of measuring instruments already in a wafer manufacturing line, most manufacturers are not enthusiastic about adding another measuring station, particularly a tool which might be needed for repeated measurements as wafers advance along a manufacturing line from one stage to another.

Certain semiconductor wafer processing operations require that the surface of silicon wafers remain wet. An example of such a processing operation is chemical mechanical polishing ("CMP"). Historically, silicon wafers have been kept wet by placing a cassette holding the wafers in a bath of water, usually de-ionized water. One difficulty with the preceding technique for keeping silicon wafers wet is that an operator, after turning off the, mechanical handling portion of the process, must reach a gloved hand into the water bath to retrieve the cassette.

SUMMARY OF THE INVENTION

An object of the present invention is to provide a wafer mapper tool for wafer manufacturing operations which does not require much additional space in a manufacturing line, and that can be used repeatedly between various steps in the manufacturing process.

Another object of the present invention is to provide an environment in which silicon wafers are maintained wet without immersing them within a bath of water.

Another object of the present invention is to provide an ergonomic wafer mapper tool that maintains silicon wafers wet.

Briefly, the present invention is a load port interface adapted to be secured to a bulkhead that is located between a process environment and an operator environment at a port that pierces the bulkhead. The load port interface includes a port closure assembly which when disposed in a first orientation permits an operator when present in the operator environment:

1. to deposit a cassette carrying a wafer stack, W, onto the port closure assembly; and
2. to remove a cassette carrying a wafer stack, W, from the port closure assembly.

When the load port interface is disposed in a second orientation positions the cassette carrying the wafer stack, W, in the process environment, and seals the bulkhead thereby separating the process environment from the operator environment.

The load port interface also includes means for directing droplets of liquid about a wafer stack, W, when the port closure. assembly is disposed in the second orientation. Preferably, the means for directing droplets of liquid is a plurality of nozzles which direct a spray of liquid droplets about the wafer stack, W. The preferred embodiment of the load port interface also includes a pair of spray shields that project outward from the bulkhead so the wafer stack, W, when in the operator environment, becomes disposed between both spray shields.

This load port interface also preferably includes a wafer mapper carried in the port closure assembly that has front and back panels which enclose the wafer mapper. In one embodiment, a panel acts as a box-like housing for the mapper. At the same time, at least one of the panels must seal the port through the bulkhead. To accomplish this a door of the port closure assembly is hinged in a manner allowing the door to be horizontal, on the operator side, of the bulkhead for loading and locking of a cassette onto the door, with the wafers within the cassette in a vertically upright position. A port cover plate is connected to the door panels by an angle bracket and a pivot. The cover plate has dimensions for sealing the port in the bulkhead. The cover plate makes an L-shape relative to the panel members so that each of the cover plate and the door panels is able to seal the port in the load port interface. Upon closing the door, the door moves to a vertical position by a 90 degree rotation, sealing the port, re-orienting the wafers to a horizontal position on the process side of the bulkhead. The wafers are held in place since the cassette is locked in place onto the door. The cassette is open at the top and bottom, being wider at the top than at the bottom, allowing optical inspection of the cassette through the top or bottom. Since the top of the cassette is now oriented horizontally, facing the back panel of the door, the optical inspection apparatus of the wafer mapper can determine wafer positions in the cassette through a window in the back panel of the door.

The wafer mapper consists of a miniature trolley, riding on a rail and driven by a leadscrew, all mounted between the front and rear panels of the door. The trolley carries a pair of beam sources, such as semiconductor lasers, as well as mirrors and optical detectors. The beam sources and mirrors direct a pair of beams onto the mirrors, then through a window in the trolley housing onto the expected position of a wafer. If light is reflected by a wafer edge, the optical detectors will detect the scattering, recording the reflected light signal from the wafers. The trolley is driven by a motor for advancing the trolley incrementally from one end of the door, say the upper end to the opposite end of the door and then back again. An air knife on the opposite side of the window is dragged by a magnet carried by the trolley in order to clear the window of moisture droplets. The motor is preferably a stepper motor whose motion is precisely known relative to a starting point. In this manner the known position of the trolley may be related to light scattering from individual wafers, thereby mapping the position of wafers in the cassette. The known wafer positions are recorded by a computer and passed along to other instrumentation, such as process equipment.

These and other features, objects and advantages will be understood or apparent to those of ordinary skill in the art from the following detailed description of the preferred embodiment as illustrated in the various drawing figures.

BRIEF DESCRIPTION OF THE DRAWINGS

FIG. 1 is a side elevational view of a load port interface of the present invention showing a wafer mapper associated with a door and a wafer cassette with the door in an open position on the operator side of the interface;

FIG. 2 is a side elevational view of the load port interface of FIG. 1 with the door in a partially closed position;

FIG. 3 is a side elevational view of the load port interface of FIG. 1 with the door in a closed position;

FIG. 4 is a rear perspective view of the apparatus shown in FIG. 3;

FIG. 5 is an exploded perspective view of a wafer mapper shown in FIG. 1;

FIG. 6 is a rear perspective view of a trolley used in the wafer mapper shown in FIG. 5;

FIG. 7 is a rear perspective view of an air knife follower assembly used in the wafer mapper of FIG. 5;

FIG. 8 is a perspective view of a wafer mapper probing wafers in a wafer stack in accord with the present invention, showing the trolley of FIG. 6 in an upper position;

FIG. 9 is a perspective view of a wafer mapper probing wafers in a wafer stack in accord with the present invention, showing the trolley of FIG. 6 in a lower position.

DETAILED DESCRIPTION

Figure 10:
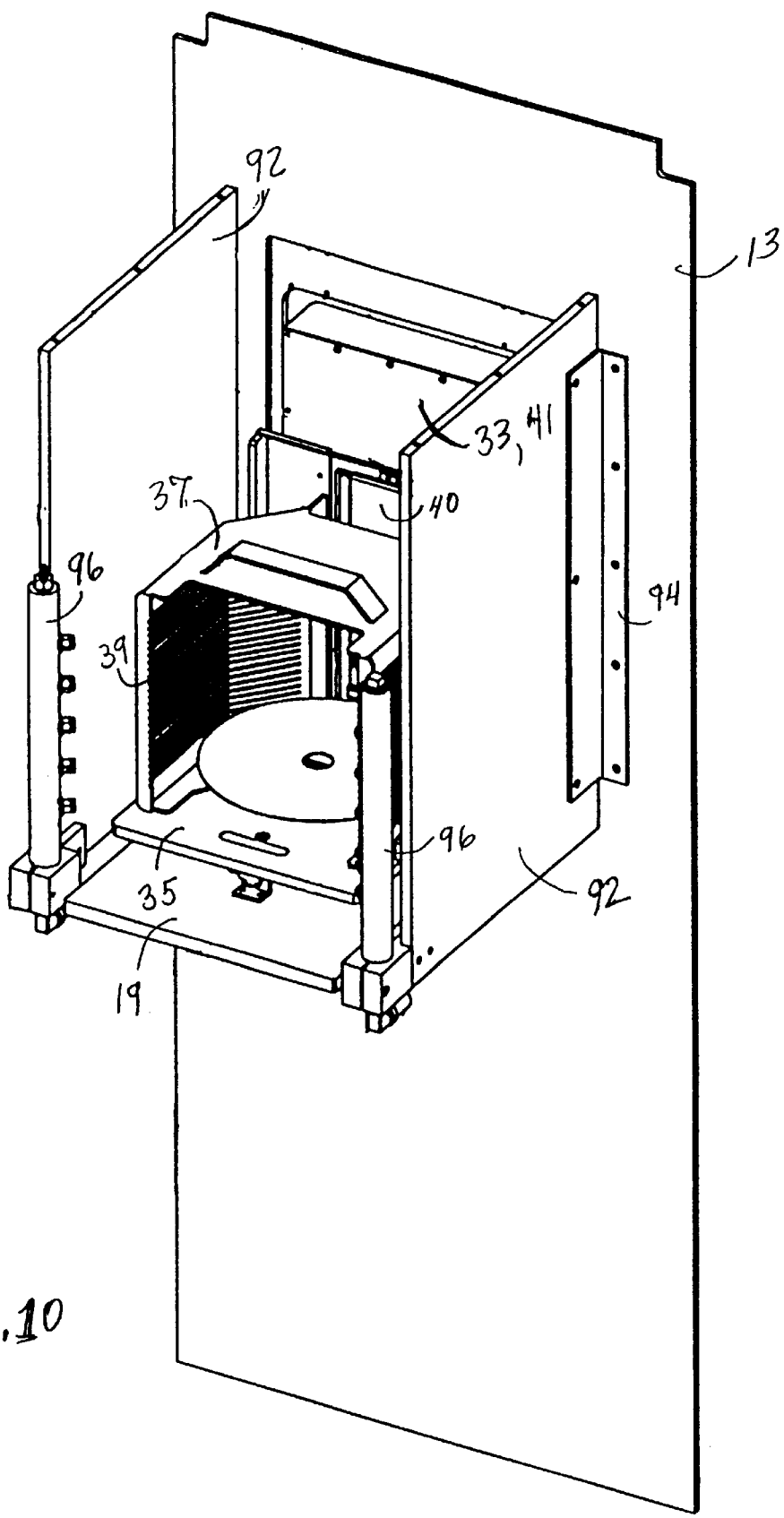
FIG. 10 is a perspective view of a load port interface equipped to maintain the silicon wafers wet while they remain on the process side of the interface.

With reference to FIG. 1, a load port interface 11 has an upright bulkhead 13 separating two environments. Typically, one environment shown on the right hand side, is an operator side 14, while the opposite side of the bulkhead 13 is a process side 16. The operator side environment is typically an ambient dry environment. The process side 16 contains wafer processing equipment, not shown, which receives wafers from the operator side 14 for one or more out of several hundred steps involved in wafer processing. Many times the process side 16 is a wet environment, or an environment in which the wafers are kept wet. The bulkhead 13 has an opening or port 15 which is usually kept closed, except when wafers are transferred from one side of the bulkhead 13 to the other. Closing the port 15 is a port closure assembly 17 which includes a cover plate 19 having a compressible seal 20 that allows the cover plate 19 to seal the port 15. The cover plate 19 is pulled tight against the bulkhead 13 by a latch, not shown. A pivot 23 connects to a pivot arm 24 which transfers motion to a right angle bracket 27. One end of the right angle bracket 27 is connected to cover plate 19 while the other end of the right angle bracket 27 is connected to a front panel 31 of the port closure assembly 17. A spring 25 provides a bias to the right angle bracket 27 tending to bring the front panel 31 upwardly, with rotational motion shown by the arrow A. To guard against too rapid motion of the port closure assembly 17, a damper (not illustrated in any of the FIGs.) is connects to the right angle bracket 27 to restrict the rate of closure and prevent slamming of the front panel 31 against the bulkhead 13. When the panel is in the position shown in FIG. 1, the spring 25 applies insufficient force to close the port closure assembly 17 against the bulkhead 13. In this orientation, the front panel 31 rests in a horizontal position, much like an open oven door. In order to raise the front panel 31, the port closure assembly 17 includes a handle 29 so an operator can initiate upward motion of the panel causing rotation of the cover plate 19. Rotation of the cover plate 19 opens the port 15 so that a cassette 37, resting on a back panel 33 can pass through the port 15 to the process side 16 of the bulkhead 13.

The front panel 31 is part of a door 21 which includes a wafer mapper 41 which is sandwiched between the front panel 31 and the back panel 33. In the present invention, the wafer mapper 41 is shown to be part the door 21, being located between the front and back door panels 31 and 33. However, the wafer mapper 41 could be associated with a door by resting atop a thin door and being totally outside of the door but having essentially the same configuration as shown in FIG. 1.

The cassette 37 is placed atop the back panel 33 and against a wall 35 that extends outward from the back panel 33. The cassette 37 is held in place by a corner bracket 36 which helps maintain orientation of the wall 35 in relation to the back panel 33. There are other guide members atop back panel 33 which assist in locating the cassette 37 in a desired position. The cassette 37 contains wafer compartments 39 which loosely seat silicon wafers in a parallel alignment. A handle 42 on the cassette body allows an operator to push the cassette 37 into a desired position where it is held by guides on the back panel 33.

FIG. 2 shows the cassette 37 being moved from the operator side 14 to the process side 16 as the port closure assembly 17 is rotated in the direction of arrow B, as an operator pushes on the handle 29. As cover plate 19 moves toward a horizontal position, the front panel 31 moves towards a vertical position. As the door 21 moves, the cassette 37 rotates with wafers in place. Because of slow rotation, resulting from the damper associated with pivot 23, the wafers remain within the cassette 37.

FIGS. 3 and 4 show full rotation of the cassette 37 so that the wafer compartments 39 are now horizontal. The wafer mapper 41 is in an upright position between back panel 33 and front panel 31. The front panel 31 may have a compressible seal 32 which seals the port 15 of the bulkhead 13. In this orientation, the weight of the cassette 37 bearing on the wall 35 applies pressure to compressible seal 32 around the periphery of front panel 31. The right angle bracket 27 has rotated by 90 degrees and spring 25 is now in its relaxed state. The wafers held in wafer compartments 39 are now ready for mapping by beams of light which pass through a glass window 40 located in the back panel 33 as depicted in FIG. 4.

With reference to FIG. 5, the wafer mapper 41 is seen to have a front cover 43 which is illustrated as removed from the main body of the wafer mapper 41. The front cover 43 includes the glass window 40 allowing optical communication between optics within the wafer mapper 41 and a wafer stack, W, on the process side 16 of the bulkhead 13. The front cover 43 is joined to a back cover 47 which acts as a box housing for mapper components. A window 79 in the back cover 47 allows an operator on the operator side 14 of the port 15 in which the wafer mapper 41 is mounted to look into the port 15 and observe a wafer stack, W, to see if the apparatus is operating properly.

One of the main components disposed within the handle 42 is a moveable trolley 51 which is supported on one side by a rail 53 and driven on the other side by a leadscrew 59. The trolley 51 includes a guide block 55 which slides along the rail 53. On the opposite side of the trolley 51, a follower member 61, a nut-like device, is threaded on the leadscrew 59. As the leadscrew 59 turns, the follower member 61 is forced to move in one direction or the other, just as a nut would move. A motor 63, fixed in place in an upper corner of the back cover 47, turns the leadscrew 59. The far end of the leadscrew 59 is mounted in a bearing block 64 positioned so that trolley 51 moves in a straight line.

The principal component of trolley 51 is a carriage 57, supported between the guide block 55 and follower member 61. The carriage 57 has an angled support 69 which seats a first mirror 65 and a second mirror 67. The first and second mirrors 65 and 67 fold paths of light beams generated by two diode laser emitters that are located within a first mounting 71 and a second mounting 73, respectively. Although only one emitter and detector pair is necessary, two may be used to provide redundancy in case of failure or obstruction of one. Within each of the first and second mountings 71 and 73 is both a beam source and a detector for reflected light, such as a sensitive photo detector.

The trolley 51 has a home position that is detected by a finger 81 which projects into a proximity sensor 87 which may be a magnetic or optical device for detecting entry of the finger 81. A second sensor 75 detects the lowermost travel of trolley 51 in which the angled support 69 enters fully into a foot portion 77 of the back cover 47. The second sensor 75 provides a signal to the motor 63 to indicate to the motor 63 that the trolley 51 should descend no further. Similarly, the finger 81, when fully entrant into proximity sensor 87, provides a signal to the motor 63 that the trolley 51 should rise no further.

The front cover 43 carries a pair of parallel, vertical tracks 44 along opposite edges of the window 40. The parallel tracks 44 guide vertical movement of a slidable, window drying, air knife assembly 46. The air knife assembly 46 is pulled by a magnet 68 on the trolley 51 on the opposite side of the front cover 43. An air hose 48 supplies air to the air knife assembly 46 to blow away moisture particles which may come from any wet process on the process side 16 of the door 21. Such moisture particles can cause refraction of light from the beam emitters on the trolley 51. Refracted light could cause a misreading of the reflected optical signal coming from a wafer edge or surface, causing a system error. Removing moisture particles from the window 40 eliminates this source of error.

In a back view of the carriage 57 illustrated in FIG. 6, the guide block 55 may be seen to have generally U-shaped members for grabbing the rail 53 depicted in FIG. 5. The U-shaped members of the guide block 55 may be inwardly convergent to provide positive gripping of the rail 53. The finger 81 is seen to project upwardly, above the guide block 55. The angled support 69 is seen to project downwardly and away from a base 70 which carries the. first and second mountings 71 and 73. The leadscrew's follower member 61 is seen below the motor 63. A pair of guide plates 72 and 74 help maintain parallel alignment of the leadscrew 59 with the rail 53. The guide plates 72 and 74, which barely clear a back wall of the back cover 47 of the wafer mapper 41, are primarily to assist in positioning of the carriage 57 during assembly of the trolley 51 onto the rail 53 and the leadscrew 59.

In FIG. 7, a back side of the slidable air knife assembly 46 is seen to have a magnet 52 in a carrier 54 mounted to a plate 56. The magnet 52 has a polarity which engages an opposite polarity of the magnet 68 carried by the trolley 51 in FIG. 5. The magnets 52 and 68 are strong enough so that motion of the trolley 51 causes the same motion of air knife assembly 46 on the opposite side of the window 40 due to linkage of the magnetic fields of the two magnets 52 and 68 through the window 40. The plate 56 has track followers 60 projecting outwardly at corners of the plate 56 in positions which will slide within the parallel tracks 44 on opposite sides of the window 40. A pair of air jets 62 receive clean dry air, or any dry gas compatible with the process being carried out on the process side 16 of the window 40, at moderate pressure from the air hose 48 that attaches to a gas inlet nozzle 66. The air jets 62 direct the dry gas in cone or fan shaped patterns toward the window 40. When the gas patterns reach the window 40 they overlap to form an air knife which clears the window 40 of moisture particles. A pair of cut-out regions 58, that pierce the plate 56, provide apertures in the immediate vicinity of the air knife for the light beams from the beam emitters to pass through the plate 56 and for reflected light to reach the detectors.

In FIG. 8, the trolley 51 is seen in a upper position with the motor 63 at the top of the back cover 47. Note that the front cover 43 is omitted in FIGS. 8 and 9 for purposes of explanation of the operation of optical members carried by the trolley 51. The trolley 51 moves vertically as indicated by the arrow C. Optical beams indicated by a letter D, project into the wafer stack, W, at a angle established by the first and second mirrors 65 and 67. The first and second mirrors 65 and 67 are inclined at the same angle. These mirrors direct the beams, D, to impinge upon wafers in the wafer stack, W. Note that the cassette 37 is also omitted in FIGs. 8 and 9 for purposes of explanation of the operation of optical members carried by the trolley 51. The beams, D, impinge upon the wafers at a small angle of incidence, preferably only a few degrees which provides a moderate amount of reflectance of the beam from the wafer edge. The cassettes 37 are precisely manufactured such that the positions of wafer holding slots are generally known. If the beams, D, are not reflected, a computer to which the optical detectors are connected may assume that a wafer is missing from the wafer stack, W. The objective of the wafer mapper 41 is to determine whether or not wafers are in all of the slots of the cassette 37 or whether some wafers are missing.

Since the trolley 51 has a known starting position and because. the motor 63 is preferably a stepper motor which advances the trolley 51 in known increments, the position of the trolley 51 is precisely known as it descends past the wafer stack, W. Each light beam from the trolley 51 essentially scans the wafer stack, W, recording the presence of signal and the absence of signal. A more mathematical treatment of the data is set forth in patent application no. Ser. No. 09/038,809 filed Mar. 11, 1998, in the name of J. Gordon et al., assigned to the assignee of the present invention and incorporated by reference herein. Such a mathematical treatment of the data is optional.

In FIG. 9, the trolley 51 has descended to the lower limit of travel in which the angled support 69 is at the limit of the foot portion 77. Disposed in this position the first and second mountings 71 and 73 generate beams D which are below the lowest wafer in the wafer stack, W, thereby completing reflectance signals from the wafers. The motion of the trolley 51 may now be reversed, with the trolley 51 moving upward. Another series of measurements may be made of the wafer stack, W, as the trolley 51 moves to its home position at the top of the back cover 47. The measurements made going up are compared with the measurements made going down to confirm wafer positions within a wafer stack, W, of a cassette 37.

It is possible to use the beams to gather information about the wafers, other than presence and absence in a stack, W. For example, each wafer in a stack, W, includes a notch, N. The notch is a wafer orientation device. If wafers are prealigned, with all notches in similar orientations, it is possible to gather information about the wafer which is sometimes printed on the wafer with readable characters or bar code. The optical reading of indicia or bar code is done with CCD array detectors looking at a reflected signal. Similarly, dirt on a wafer may be judged by the quality of the backscatter signal and the information content within the back scatter signal. With a low angle of illumination, the backscatter signal is optimum.

Referring now to FIG. 10, the port closure assembly 17 may also include a pair of planar spray shields 92 that project outward from the bulkhead 13, and are respectively disposed along opposite sides of the cover plate 19. The spray shields 92 are respectively secured to the bulkhead 13 by an L-shaped angle bracket 94, only one of which appears in FIG. 10. The port closure assembly 17 also includes a pair of spray manifolds 96 that are respectively secured along an edge of each spray shield 92 furthest from the bulkhead 13. After the door 21 is closed and while the wafer mapper 41 is not scanning the wafer stack, W, a set of nozzles 98 secured respectively along each of the spray manifolds 96 emit a fine spray of liquid droplets that the spray shields 92 confine to the space occupied by the cassette 37 and the wafer stack, W.

Confining the fine spray of liquid to the space occupied by the cassette 37 and the wafer stack, W, in this way is particularly advantageous if the bulkhead 13 is pierced by several ports 15 arranged side-by-side along the bulkhead 13. In such a configuration of several port closure assemblies 17, the spray shields 92 at each port 15 block liquid being sprayed at one port 15 from entering immediately adjacent ports 15.

To maintain 200 mm diameter wafers held in a SMIF cassette 37 wet while they undergo CMP processing, de-ionized water is supplied to each nozzle 98 at approximately 20 pounds/in$^2$ and intermittently sprays approximately 0.15 liters/minute of that water into the space between the spray shields 92. All the nozzles 98 combined spray water into that space at a rate of approximately 4.0 liters/minute with a duty cycle that, depending upon the particular process being performed and the precise processing conditions, may range between 10% up to 100% on. For CMP processing, the preferred operating mode is to repeatedly spray the wafers for an interval of approximately 3.0 that repeats approximately every 30 seconds.

Although the present invention has been described in terms of the presently preferred embodiment, it is to be understood that such disclosure is purely illustrative and is not to be interpreted as limiting. For example, instead of the spray manifolds 96 with their respective nozzles 98, the wafer stack, W, could be kept wet by an ultrasonic humidifier that directs a cloud of liquid droplets directed about the wafers. Moreover, the seals 20 and 32, which preferably utilize a compressible, hollow tubular sealing material, rather than being respectively disposed on the cover plate 19 and front panel 31, may be disposed on opposite sides of the bulkhead 13. Consequently, without departing from the spirit and scope of the invention, various alterations, modifications, and/or alternative applications of the invention will, no doubt, be suggested to those skilled in the art after having read the preceding disclosure. Accordingly, it is intended that the. following claims be interpreted as encompassing all alterations, modifications, or alternative applications as fall within the true spirit and scope of the invention.

What is claimed is:

1. A load port interface adapted to be secured to a bulkhead that is located between a process environment and an operator environment at a port that pierces the bulkhead, the load port interface comprising:

a port closure assembly which:
  when disposed in a first orientation permits an operator when present in the operator environment:
    to deposit a cassette carrying a wafer stack, W, onto the port closure assembly; and
    to remove a cassette carrying a wafer stack, W, from the port closure assembly; and
  when disposed in a second orientation positions the cassette carrying the wafer stack, W, in the process environment, and seals the bulkhead thereby separating the process environment from the operator environment; and moistening means for directing droplets of liquid about a wafer stack, W, when said port closure assembly is disposed in the second orientation.

2. The load port interface of claim 1 wherein the moistening means includes a plurality of nozzles that direct a spray of liquid droplets about the wafer stack, W.

3. The load port interface of claim 1 wherein the moistening means includes an ultrasonic humidifier that directs a cloud of liquid droplets about the wafer stack, W.

4. The load port interface of claim 1 wherein the port closure assembly includes seals for sealing between the port closure assembly and the bulkhead when the port closure assembly is disposed both in the first orientation and in the second orientation.

5. The load port interface of claim 1 further comprising at least a pair of spray shields that project outward from the bulkhead so the wafer stack, W, when in the operator environment, becomes disposed therebetween.

6. The load port interface of claim 1 wherein the port closure assembly includes spaced apart front and back door panels connected together as a cover for a port in a bulkhead of a load port interface, the back panel having a window therein, a wafer stack, W, disposed in optical communication with the window, and a wafer inspection unit associated with the door panels and having a beam source and a beam detector, the beam passing to and from the wafer stack, W, relative to the inspection unit through the window.

7. The load port interface of claim 6 wherein the wafer stack, W, is an arrangement of wafers in a cassette supported by the back panel of the door.

8. The load port interface of claim 7 wherein spaced apart guide members establish a position of said cassette.

9. The load port interface of claim 6 wherein the wafer inspection unit is mounted for motion along the wafer stack, W, on a carriage supported by at least one rail and driven by a leadscrew.

10. The load port interface of claim 9 wherein the wafer inspection unit comprises a beam source and an optical detector.

11. The load port interface of claim 10 wherein the wafer inspection unit comprises a wafer mapper unit.

12. The load port interface of claim 6 further defined by a cover plate connected to door panels of the port closure assembly by an angle bracket, the cover plate having dimensions for sealing the port in the bulkhead when the port closure assembly is disposed in the first orientation.

13. The load port interface of claim 12 wherein the cover plate is connected to the door panels forming an L-shape having a pivot for rotation of the connected members whereby each of the cover plate and the door panels is able to close the port in the load port interface.

14. The load port interface of claim 13 wherein the wafer cassette is mounted next to the wafer mapper and rotates through the port through the bulkhead from one side of the bulkhead to the other side.

15. The load port interface of claim 6 wherein the wafer inspection unit is mounted between the door panels.

16. The load port interface of claim 6 wherein a movable air knife is magnetically coupled to the wafer inspection unit on the opposite side of the window therewith.

17. A door assembly for a load port interface comprising, a port cover plate and a front door panel disposed in an L-shape configuration and connected by a bracket, the cover plate and door panel mounted for rotation through an angle whereby either the port cover plate or the front door panel closes a port that pierces the load port interface, an open top wafer cassette containing a wafer stack supported for movement with the front door panel, whereby rotation of the front door panel brings about rotation of the wafer cassette, and a wafer mapper unit connected to the front door panel having a beam source directing a beam into the wafer stack through a window in the front door panel and the open top of the wafer cassette and a scattered light detector receiving light scattered from the wafer stack, the beam source and light detector mounted on a trolley moveable parallel to the wafer stack.

18. The apparatus of claim 17 wherein the front door panel is a box shaped housing mounting the trolley on parallel linear members.

19. The apparatus of claim 18 wherein one of the parallel linear members is a leadscrew.

20. The apparatus of claim 17 wherein the beam source is a laser.

21. The apparatus of claim 17 wherein the light detector is a scattered light detector.

22. The apparatus of claim 18 wherein the trolley supports a mirror means for folding the path of the beam between the source. and the wafer stack.

23. The apparatus of claim 18 wherein the trolley has a movable air knife on the opposite side of the window coupled to the trolley.

24. The apparatus of claim 17 where the trolley includes a sensor capable of indicating a start position for the trolley.

25. The apparatus of claim 17 wherein the trolley includes a second sensor capable of indicating a stop position for the: trolley.

26. A load port interface comprising, a bulkhead with a window having a process side and an operator. side, the process side having a wafer stack adjacent to the window, a wafer inspection unit associated with the bulkhead adjacent to the window on the process side, the inspection unit having a trolley moveable over the window, the trolley carrying a beam emitter directing a beam through the window toward the wafer stack and having a beam detector positioned to detect light coming from the beam detector, and a movable air knife adjacent to the window on the process side, the air knife magnetically coupled to the trolley through the window and movable with the trolley.

27. The apparatus of claim 26 wherein the bulkhead has a door and said wafer inspection unit is mounted inside of the door.

* * * * *